United States Patent
Ghia

[11] Patent Number: 6,101,143
[45] Date of Patent: Aug. 8, 2000

[54] SRAM SHUTDOWN CIRCUIT FOR FPGA TO CONSERVE POWER WHEN FPGA IS NOT IN USE

[75] Inventor: Atul V. Ghia, San Jose, Calif.

[73] Assignee: Xilinx, Inc., San Jose, Calif.

[21] Appl. No.: 09/221,225

[22] Filed: Dec. 23, 1998

[51] Int. Cl.[7] .................................................. G11C 7/00
[52] U.S. Cl. .......................... 365/227; 365/154; 326/39; 326/40
[58] Field of Search .................... 365/227, 229, 365/226, 154; 326/39, 40; 395/750.01, 750.03, 750.05, 750.06

[56] References Cited

U.S. PATENT DOCUMENTS

| | | | |
|---|---|---|---|
| 4,096,584 | 6/1978 | Owen, III et al. | 365/227 |
| 4,455,627 | 6/1984 | Oritani | 365/227 |
| 4,918,658 | 4/1990 | Shah et al. | 365/227 |
| 5,563,839 | 10/1996 | Herdt et al. | 365/227 |
| 5,646,902 | 7/1997 | Park | 365/227 |
| 5,712,826 | 1/1998 | Wong et al. | 365/226 |

*Primary Examiner*—Tan T. Nguyen
*Attorney, Agent, or Firm*—Ronald Craig Fish

[57] ABSTRACT

A circuit and method for FPGAs to allow a user to supply a shutdown signal at an external pin which causes internal circuitry in the FPGA to turn off pass transistors in the word lines of every SRAM cell in the FPGA thereby preventing wasted power by current drain to ground through an SRAM cell that happens to be addressed when the FPGA is not being used.

6 Claims, 2 Drawing Sheets

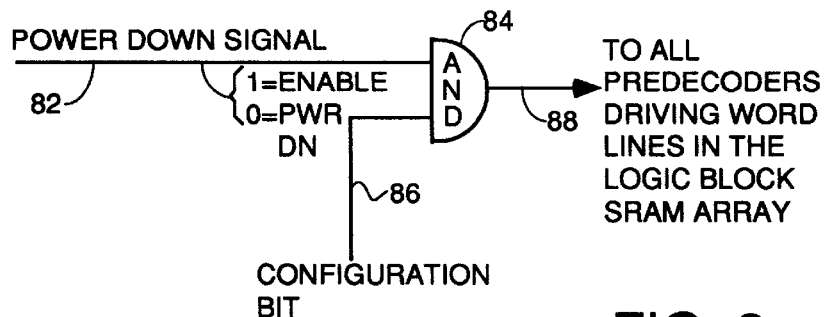
FIG. 3
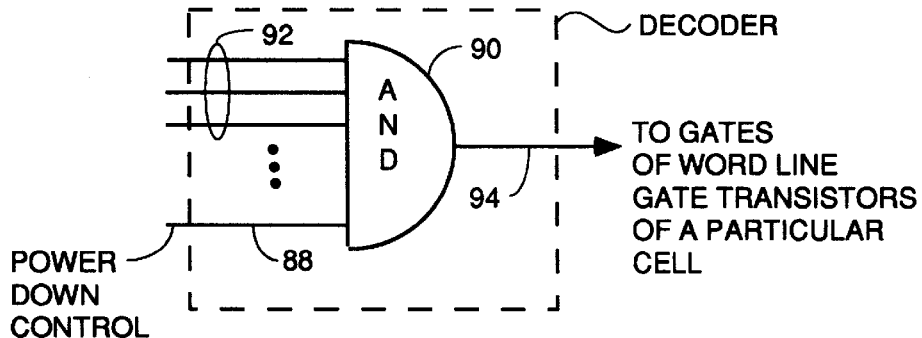
FIG. 4
| POWER DOWN SIGNAL LINE 82 | CONFIG BIT LINE 86 | LINE 88 | ADR BITS LINE 92 | LINE 94 | RESULT |
|---|---|---|---|---|---|
| POWER DN ACTIVE  0 | 1 | 0 | DON'T CARE | 0 | SRAM CELL POWERED DN |
| 1 | 1 | 1 | ALL ONES | 1 | WORD LINE GATES ON |
| 0 | 0 | 0 | DON'T CARE | 0 | SRAM CELL POWERED DN |
| 1 | 0 | 0 | DON'T CARE | 0 | SRAM CELL POWERED DN |
SRAM DISABLED
FIG. 5

SRAM SHUTDOWN CIRCUIT FOR FPGA TO CONSERVE POWER WHEN FPGA IS NOT IN USE

FIELD OF USE

The invention is useful in the field of field programmable gate arrays (FPGA) to provide flexibility to shut off power consumption by static random access memory (SRAM) on the FPGA.

Some FPGAs in the prior art have SRAM on every logic block on the chip to store data and which may used to create FIFO memories. These distributed SRAM cell groups are each constructed like conventional CMOS SRAM cells with word lines, bit lines and pullups. The addressing circuitry is onboard the FPGA and generates addresses that are used to control which cells have their word lines and bit lines turned on such that they may be accessed. This address generation circuitry is controlled by the logic blocks and may not be turned off by the user. When the user is not using the FPGA, the address generation circuitry stays stuck on one address. For the cell or cells that have that address, this causes the word lines and bit lines to be turned on so as to be able to access the memory cell. When the bit line and word line of a cell are turned on, it drains current to ground from the high rail through the lower NMOS device of the SRAM cell. This represents a waste of current.

Most customers for FPGAs have power consumption specifications that must be met before they will buy the FPGA. One way of saving on power consumption is to avoid wasting any current when the user is not using the FPGA. However, the FPGA itself has no way of determining when the customer is not using it. Therefore, a need has arisen for an FPGA with an external signal input which allows the user to send a signal to the FPGA to cause it to power down including stopping all power consumption by SRAM cells that are turned on by whatever address the address generation circuitry is generating.

SUMMARY OF THE INVENTION

The genus of the invention contemplates all species of circuits on-board an FPGA which have the functionality to receive an external power down signals and shut off power flow through whatever SRAM cell on the FPGA is drawing power when the external signal is in a power down state.

More specifically, any circuitry which has the capability to receive the power down from the user at the external pin on the FPGA and turn off either the word line transistors (such as transistors 16 and 18 in FIG. 1) or the bit line pullup transistors (such as transistors 30 and 32 in FIG. 1) for the interval during which the external signal is in the active power down state is within the genus of the invention.

BRIEF DESCRIPTION OF THE INVENTION

FIG. 3 is a diagram of the gating structure that is used in the preferred embodiment to gate the power down signal through to every SRAM cell which is configured to be on.

FIG. 4 is a diagram of of the preferred predecoder gating structure to combine the address bits and the power down signal to generate a control signal which controls the on or off state of MOS pass transistors in the word lines of each SRAM cell to turn then on or off depending upon the state of the power down signals.

FIG. 5 is a truth table showing the states of the word line pass transistors for various states of the configuration bit, power down signals and the address bits.

DETAILED DESCRIPTION OF THE PREFERRED AND ALTERNATIVE EMBODIMENTS

Figure 1:
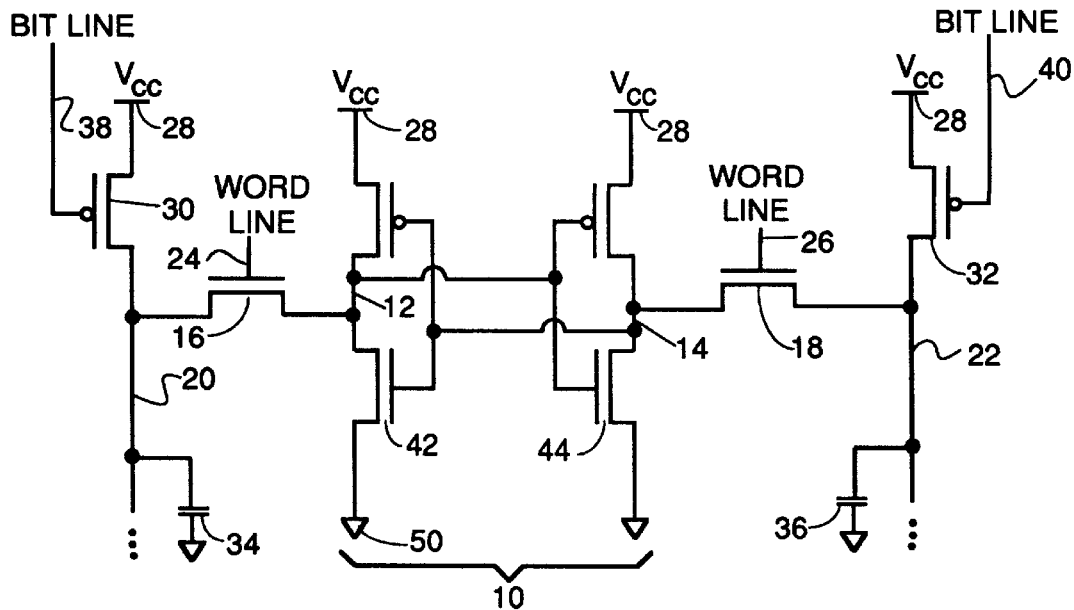
FIG. 1 is a schematic diagram of a prior art SRAM cell in an FPGA.

Referring to FIG. 1, there is shown a prior art SRAM cell in an FPGA. SRAM cell is comprised of a cross-coupled pair of CMOS inverters. The output nodes 12 and 14 are coupled by NMOS transistors 16 and 18 to bit lines 20 and 22. The gates of transistors 16 and 18 are coupled to word line conductors 24 and 26 which are driven by address generation circuitry which is not shown. Each of the bit lines 20 and 22 is coupled to the Vcc high rail by PMOS transistors 30 and 32. The gates of PMOS transistors 30 and 32 are driven by bit line control signals on line 38 and 40 from the address generation circuitry. Each of the bit lines has a parasitic capacitance to ground represented by capacitors 34 and 36. There are a plurality of such SRAM cells throughut an FPGA.

Assuming that the address generation circuitry is stopped on the address of the SRAM cell 10 in FIG. 1 when the user is not using the FPGA, the bit line control signals on lines 38 and 40 will be in logic states to turn transistors 30 and 32 on. Likewise, the word line control signals on line 24 and 26 will be in such a logic state as to turn transistors 16 and 18 on. The SRAM cell will be storing either a 1 or a 0. Regardless of whether the SRAM cell stores a 1 or a 0, one of NMOS transistors 42 or 44 will be turned on. In this situation, current will flow from high rail 28 through transistor 30 or 32 and through transistor 16 or 18 and through transistor 42 or 44 to ground 50. Likewise, some current will flow through each of capacitors 34 and 36 to ground until they become charged. These current flows represent wasted power and cause the FPGA to consume more power than is necessary when it is not being used.

The bit line pullup transistors 30 and 32 in the SRAM cell 10 cannot be turned off to prevent this problem without adversely affecting the performance of the SRAM cell. If the bit line pullup transistors are turned off when the FPGA is not being used, they must be turned back on when the FPGA goes back into use. This takes time to do and this time to turn the bit line pullup transistors back on and charge up the large bit line parasitic capacitances 34 and 36 again is added to the normal access time of the SRAM cell on the first cycle which adversely affects performance. Further, if the bit line pullup transistors were turned off when the FPGA is not being used, it creates a cell instability issue. This instability issues arises from the fact that when the bit line pullup transistors are turned off, the bit lines float and they can float high or float low. When they float low, they can actually flip the data stored in the SRAM cell to the reverse of what was stored before the bit lines started floating. The SRAM cells are supposed to maintain the data stored therein during the time the FPGA is being used since Vcc and ground supplies are still supplying voltage to the cell to maintain its state even when the FPGA is not being used. The only way this cell instability problem can be eliminated is to turn off the word line gating transistors 16 and 18 as well.

Another way to cut off power consumption in an SRAM cell that is addressed when an FPGA is not in use is to turn off only the word line transistors 16 and 18. This also has an adverse impact on performance. Specifically, when the SRAM cell is not being addressed, both transistors 16 and 18 are off. If the word line transistors 16 and 18 are turned off, there is no path for current flow through either transistor 42 or 44 to ground in the prior art SRAM cell 10. When SRAM cell 10 is addressed, both word line transistors 16 and 18 are turned on by the addressing circuitry and the bit line transistors 30 and 32 are also turned on. This causes current flow to ground through either transistor 42 or 44 depending upon the bit that is stored in cell 10. The problem with using the word line transistors to shut off current flow through the SRAM cell 10 when the cell is addressed but the FPGA is not being used is that the access time is 5 to 7 nanoseconds from clock transition to data output as long as the word line transistors 16 and 18 are on during the 5–7 nanoseconds between the clock transition and the data output. The SRAM of the FPGAs of the assignee are designed to be high performance and have low access times. This is done by preprocessing the next address during the hold time of the previous address so as to get the parasitics on the word lines and decoder charged up sufficiently such that the decoder and selected word line can change states rapidly to access the cell identified by the next address as soon after the next clock edge as is possible. If power conservation during active mode is attempted by shutting off the word line transistors 16 and 18 between access cycles, it slows down the access times by the amount of time it takes to turn these transistors back on. If the word line transistors 16 and 18 are shut off during inactive mode, then they must be turned on prior to performing the first access after wake up, and this will add time to the access time of the first cycle.

The SRAM is the principal consumer of power in the FPGA when the chip is not in use. The configuration memory cells and memory cells inside the logic blocks are CMOS static latches. These latches only consume power when they switch from one state to another, so when the FPGA is not being used, they do not consume power. Thus, the only consumer of power on a CMOS FPGA when the chip is not being used is the SRAM cell or cells which are being addressed by the addressing circuitry when the FPGA is not being used. Since the FPGA has no on-board intelligence to know when it is not being used, the FPGA cannot itself decide when to conserve power by shutting off the word line transistors like transistors 16 and 18 in FIG. 1 at every cell. If the FPGA were to attempt to do this, but the FPGA was actually in an active mode, there would be a serious degradation in the access time. This is because the preprocessing of the next address during the hold time of the previous address could not be accomplished.

However, if the FPGA knew positively when it was in an inactive mode, it could conserve power by shutting off the word line transistors to every SRAM cell on the FPGA. Thus, it would be useful to provide an external pin that the user of the FPGA can use to supply a signal to the FPGA to tell it when the user is not accessing the FPGA. This is the approach taken by the inventors in conserving power. An external pin is supplied by a shutdown signal. This shut down signals causes on-board FPGA SRAM shutdown circuitry according to the teachings of the invention to shut off power consumption in the FPGA SRAM circuitry by turning off the word line transistors like transistor 16 and 18 at every SRAM cell. This cuts off all power drain to ground through whatever SRAM cell is being addressed by the FPGA decoder during the time the FPGA is not being used without adversely affecting the access time.

Any circuitry which has the capability to receive the power down from the user at the external pin on the FPGA and turn off either the word line transistors (such as transistors 16 and 18 in FIG. 1) or the bit line pullup transistors (such as transistors 30 and 32 in FIG. 1) for the interval during which the external signal is in the active power down state is within the genus of the invention. In the preferred embodiment, the power down circuitry leaves whatever "bit line pullup transistors" (meaning the transistors corresponding to transistors 30 and 32 in FIG. 1) are currently addressed by the FPGA address decoder circuitry on during the interval when the external power down signal is active but turns off all "word line gates" for every SRAM cell on the FPGA where the phrase "word line gates" means the transistors that correspond to transistors 16 and 18 in FIG. 1. This method is preferred because the bit line parasitic capacitances are large so leaving the bit line pullup transistors on during the power down interval keeps these parasistic capacitances at full charge so there is no delay when the external signal goes from the power down to the wake up state where the FPGA is being actively accessed. In other words, because the bit line parasitic capacitances are already fully charged when the external power down signal transitions to the wake up state, there is no delay in charging these parasistic capacitances at wake up time. In some embodiments, all the bit line pullup transistors of all columns will be turned on when the FPGA goes into power down mode. In other embodiments, only the bit line pullup transistors of the column being addressed by the FPGA decoder during the power down interval are left on. By turning off all the word line gates during the power down interval but leaving the bit line pullup transistors on the current path is still cutoff, but the amount of parasitic capacitance that must be recharged at wakeup time is much smaller because the word line structures are much smaller physically than the bit line structures.

Figure 2:
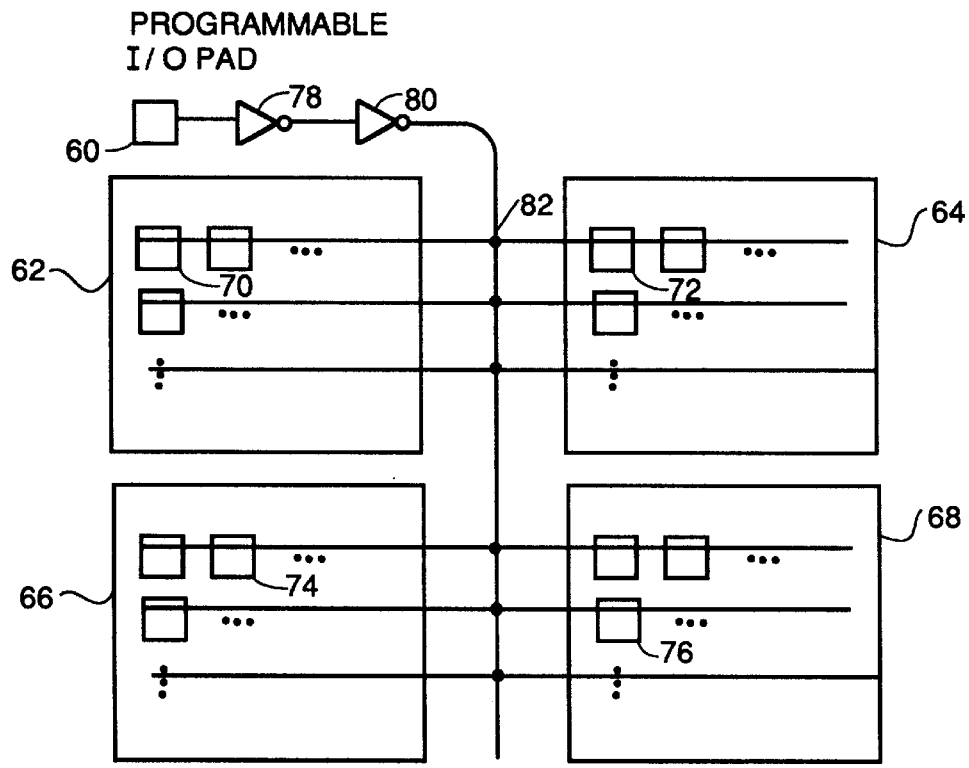
FIG. 2 is a diagram of how an shut down signal supplied to an external pin of an FPGA is distributed to all SRAM cells in all logic blocks of an FPGA with four quadrants of logic blocks.

Referring to FIG. 2, there is shown an overview of the distribution of the external power down signal to every SRAM array in every logic block. The external power down signal is received at pin 60 of the FPGA. The FPGA, in the preferred embodiment, has four quadrants of arrays of logic blocks, each of which has an array of SRAM cells on-board. The four quadrants are shown at 62, 64, 66 and 68. The logic blocks in each quadrant with SRAM arrays on-board are represented by blocks 70, 72, 74 and 76. The power down signal received at pin 60 is driven by drivers 78 and 80 (as many drivers as are necessary may be used) onto a tree distribution structure represented by tree 82 so that the power down signal reaches every logic block on the FPGA which has an SRAM array.

If any particular SRAM array of a logic block is configured by the user to be available to store data, the power down signal is gated through to the predecoders that drive every word line in the SRAM array for that logic block. FIG. 3 shows this arrangement and FIG. 4 shows a truth table of the cooperation of the, various signals with AND gate 84 and AND gate 90 discussed below. AND gate 84 is present at every logic block. The power down signal on line 82 acts as one input of every AND gate 84 at every logic block. If the SRAM array of the logic block is to be used in the functionality defined by the user for the FPGA, then a configuration bit generates a logic 1 on line 86 which gates the power down signal logic state through to line 88. In this particular configuration, the power down signal on line 82 will be a logic 1 when the SRAM array is to be active and the word line gate transistors are to be turned on, i.e., the SRAM cell is not to be powered down. If the power down signal on line 82 is a logic 0 (indicating the SRAM cell is to be powered down) and the configuration bit on line 86 is a logic 1, line 88 is a logic 0. A logic 0 on line 88 will cause all word line gates to be turned off for the power down state as will be explained below by the action of AND gate 90.

If the SRAM array of a particular logic block is not involved in the design, then the configuration bit for that logic block's SRAM array is set to a logic 0 such that line 88 maintains a constant logic 0 regardless of transitions of the power down signal on line 82. This powers down the SRAM cells of that logic block by virtue of driving input line 88 to AND gate 90 thereby forcing output line 94 to logic 0 for all states of address inputs 92 and turning off all word line gates.

The signal on line 88 is transmitted to all the decoders that generate the control signals for the gates of the word line gating transistors as one of its inputs. This decoder circuitry is shown in FIG. 4. Each SRAM cell has its own decoder in the form of an AND gate 90. The inputs to AND gate 90 represented by the group of lines labelled 92 come from the predecoders that decode the address bits that define the SRAM cell to be accessed. When these address bits on line 92 are all logic 1s, the SRAM cell associated with this decoder gate 90 is supposed to be accessed. The AND gate 90 however also receives the signal on line 88. If line 88 is a logic 0, the decoder gate 90 will output a logic 0 on line 94 regardless of the states of the inputs 92 thereby turning off the word line gates and blocking the SRAM cell from being accessed as can be seen from the truth table of FIG. 5. If line 88 is a logic 1, AND gate 90 will output a logic 1 on line 94 and turn on the word line gates of the addressed SRAM cell if all the address bits 92 are logic 1s.

Although the invention has been disclosed in terms of the preferred and alternative embodiments disclosed herein, those skilled in the art will appreciate possible alternative embodiments and other modifications to the teachings disclosed herein which do not depart from the spirit and scope of the invention. All such alternative embodiments and other modifications are intended to be included within the scope of the claims appended hereto.

What is claimed is:

1. A power down circuit for a field programmable gate array integrated circuit, hereafter FPGA, comprising:

an external pin on said FPGA for receiving a power down signal supplied from an external source;

a distribution network on said FPGA to distribute said power down signal to every static random access memory cell (hereafter SRAM cell) on said FPGA, each memory cell having word lines therein, each word line having a pass transistor with a control input for receiving a control signal which controls whether said pass transistor is turned on or turned off; and a gating circuit having an output coupled to supply said control signal to said control inputs of said pass transistors in the word lines of every SRAM cell and having inputs for receiving address bits from an address decoder on said FPGA and having an input coupled to said distribution network for receiving said power down signal, said gating circuit functioning to generate said control signal in such a way as to turn off said pass transistors when said power down signal is in a logic state indicating power consumption in said SRAM cells is to be minimized.

2. A process comprising:

receiving a power down signal supplied to a field programmable gate array integrated circuit from an external source at a pin accessible by external circuitry, said field programmable gate array integrated circuit having one or more volatile static random access memory cell latches integrated thereon, each static random access memory cell latch having two word lines and two word line MOS transistors coupled to said word lines such that current through said word line must flow through the channel of said word line transistors with the gates of both said word line transistors coupled to decoder circuitry which is part of the addressing circuitry for said one or more static random access memory cell latches to turn said word line transistors on when the memory cell is being addressed and off at other times;

using said power down signal to cut off consumption of power in all static random access memory cells in said field programmable gate array integrated circuit by, when said power down signal is in a power down logic state providing a control signal to every decoder coupled to every static random access memory cell latch that causes said decoder to turn off every word line transistor of every static random access cell memory latch.

3. An apparatus comprising:

in a field programmable gate array having a plurality of static random access memory cells, an external pin for receiving a shut down signal;

a distribution network to distribute said shut down signal to all said static random access memory cells; and a shut down circuit at every static random access memory cell which receives said shut down signal from said distribution network and, when said shut down signal is in a predetermined logic state, causing power consumption in said static random access memory cell to stop.

4. The apparatus of claim 3 wherein said shut down circuit includes an AND gate having one input to receive said shut down signal and another input for receiving a configuration signal.

5. The apparatus of claim 3 wherein said shut down circuit includes an AND gate for receiving address bits from an address decoder and an input for receiving said shut down signal.

6. The apparatus of claim 3 wherein said shut down circuit comprises first and second MOS pass transistors having their channels in series with the word lines of said SRAM cell and having gate terminals, and a first AND gate having one input to receive said shut down signal and another input for receiving a configuration signal and having an output at which a power down control signal is generated, and a second AND gate having a plurality of inputs for receiving address bits from an address decoder and having a second input coupled to receive said power down control signal from said first AND gate and having an output coupled to said gate terminals of said first and second MOS pass transistors.

* * * * *